US008692598B2

(12) United States Patent
Havens

(10) Patent No.: US 8,692,598 B2
(45) Date of Patent: Apr. 8, 2014

(54) DIGITAL PHASE LOCKED LOOP

(75) Inventor: Joseph H. Havens, Pinckney, MI (US)

(73) Assignee: LSI Corporation, San Jose, CA (US)

( * ) Notice: Subject to any disclaimer, the term of this patent is extended or adjusted under 35 U.S.C. 154(b) by 220 days.

(21) Appl. No.: 13/403,358

(22) Filed: Feb. 23, 2012

(65) Prior Publication Data

US 2013/0222026 A1 Aug. 29, 2013

(51) Int. Cl.
*H03L 7/06* (2006.01)
(52) U.S. Cl.
USPC .......................... 327/159; 327/156
(58) Field of Classification Search
USPC ............... 327/146–150, 155–159; 375/374
See application file for complete search history.

(56) References Cited

U.S. PATENT DOCUMENTS 7,911,248 B2 *  3/2011  Choi et al. .................... 327/159
7,940,097 B2 *  5/2011  Chen ............................ 327/158

OTHER PUBLICATIONS

R.B. Staszewski et al., "All-Digital Phase-Domain TX Frequency Synthesizer for Bluetooth Radios in 0.13μm CMOS," IEEE International Solid-State Circuits Conference (ISSC), Digest of Technical Papers, Feb. 2004, 10 pages.

* cited by examiner

*Primary Examiner* — Hai L Nguyen
(74) *Attorney, Agent, or Firm* — Ryan, Mason & Lewis, LLP

(57) ABSTRACT

An apparatus comprises digitally controlled oscillator circuitry, feedback circuitry operatively coupled to the digitally controlled oscillator circuitry, and comparison circuitry operatively coupled to the digitally controlled oscillator circuitry and the feedback circuitry. The feedback circuitry, in response to a clock signal generated by the digitally controlled oscillator circuitry, generates a first digital value representing a detected phase of the clock signal for a given clock signal cycle. The comparison circuitry, in response to the first digital value and to a second digital value representing a reference phase, generates a phase error value. The phase error value is useable to generate a first digital control word provided to the digitally controlled oscillator circuitry for controlling a frequency associated with the clock signal. The digitally controlled oscillator circuitry further comprises adjustment circuitry capable of applying a phase adjustment to the clock signal in response to a second digital control word.

22 Claims, 11 Drawing Sheets

710/720/730

DIGITAL PHASE LOCKED LOOP

BACKGROUND

A phase locked loop (PLL) is electronic circuitry commonly used in applications involving communications, computers and other electronic systems. For example, it is known that PLLs are typically used in the read and write channels of a hard disk drive. A hard disk drive is a non-volatile storage device which stores digitally encoded data on one or more rapidly rotating platters with magnetic surfaces, collectively referred to as the "disk." The read channel comprises circuitry for reading data from the disk in response to one or more read commands, while the write channel comprises circuitry for writing data to the disk in response to one or more write commands.

The PLL generally includes a variable frequency oscillator. The variable frequency oscillator is typically designed as an inductor-capacitor (LC) tank based voltage controlled oscillator (VCO), in which the frequency is varied by controlling the value of the tuning capacitor using a voltage dependent capacitance or varactor.

SUMMARY

Embodiments of the invention provide digital phase locked loop circuits.

For example, in one embodiment of the invention, an apparatus comprises digitally controlled oscillator circuitry, feedback circuitry operatively coupled to the digitally controlled oscillator circuitry, and comparison circuitry operatively coupled to the digitally controlled oscillator circuitry and the feedback circuitry. The digitally controlled oscillator circuitry is capable of generating a clock signal. The feedback circuitry, in response to the clock signal, is capable of generating a first digital value representing a detected phase of the clock signal for a given cycle of the clock signal. The comparison circuitry, in response to the first digital value and to a second digital value representing a reference phase, is capable of generating a phase error value. The phase error value is useable to generate a first digital control word for controlling a frequency associated with the clock signal. The digitally controlled oscillator circuitry further comprises adjustment circuitry that is capable of, in response to a second digital control word, applying a phase adjustment to the clock signal. The digitally controlled oscillator circuitry may further comprise a precharge capacitor. A bias voltage associated with the precharge capacitor is adjustable under control of precharge circuitry so that an initial frequency of the clock signal is close to a desired target frequency.

The feedback circuitry may further comprise fractional detector circuitry. The fractional detector circuitry is capable of detecting a state of the digitally controlled oscillator circuitry at a transition of a reference clock signal.

The feedback circuitry may further comprise sub-fractional detector circuitry. The sub-fractional detector circuitry is capable of detecting when the transition of the reference clock signal occurs relative to a transition in the state of the digitally controlled oscillator circuitry.

In another embodiment, an integrated circuit comprises the above-described apparatus.

In a further embodiment, a method comprises the following steps. A clock signal is generated via digitally controlled oscillator circuitry. A first digital value is generated via feedback circuitry coupled to the digitally controlled oscillator circuitry, in response to the clock signal, the first digital value representing a detected phase of the clock signal for a given cycle of the clock signal. A phase error value is generated via comparison circuitry coupled to the feedback circuitry in response to the first digital value and to a second digital value representing a reference phase. The phase error value is useable to generate a first digital control word for controlling a frequency associated with the clock signal. A phase adjustment is applied to the clock signal in response to a second digital control word.

These and other embodiments of the invention will become apparent from the following detailed description of illustrative embodiments thereof, which is to be read in connection with the accompanying drawings.

DETAILED DESCRIPTION

Embodiments of the invention will be described herein in the context of an illustrative digital phase locked loop (PLL) architecture for use in read and write channel circuitry of a hard disk drive. However, it is to be understood that embodiments of the digital PLL circuit architecture (circuitry) described herein are not limited to hard disk drive applications and can be used in various other applications. By way of further example, embodiments of the PLL circuit architecture described herein are used in clock and data recovery systems such as those implemented in a SAS (Serial Attached SCSI, where SCSI refers to Small Computer System Interface) system, a SATA (Serial Advanced Technology Attachment) system, or a SERDES (Serializer/Deserializer) system. Still further, embodiments of the digital PLL architecture described herein can be adapted for use in wireless communications systems.

As will be illustratively described herein, embodiments of the digital PLL circuit architecture serve to reduce power consumption associated with the PLL design. In addition, embodiments provide improved absolute phase accuracy to meet more stringent requirements for handling bit-patterned-media. Embodiments also serve to eliminate the delta-sigma modulation commonly used in existing channel designs for fractional frequency control, thereby eliminating a significant noise source that becomes more significant as the PLL loop bandwidth is increased in an attempt to reduce the noise contribution of the VCO. Embodiments also eliminate a phase mixer used for data clock recovery, thus saving significant power. Other embodiments of the digital PLL circuit architecture will become evident to those ordinarily skilled in the art given the descriptions of the illustrative embodiments provided herein.

Figure 1:
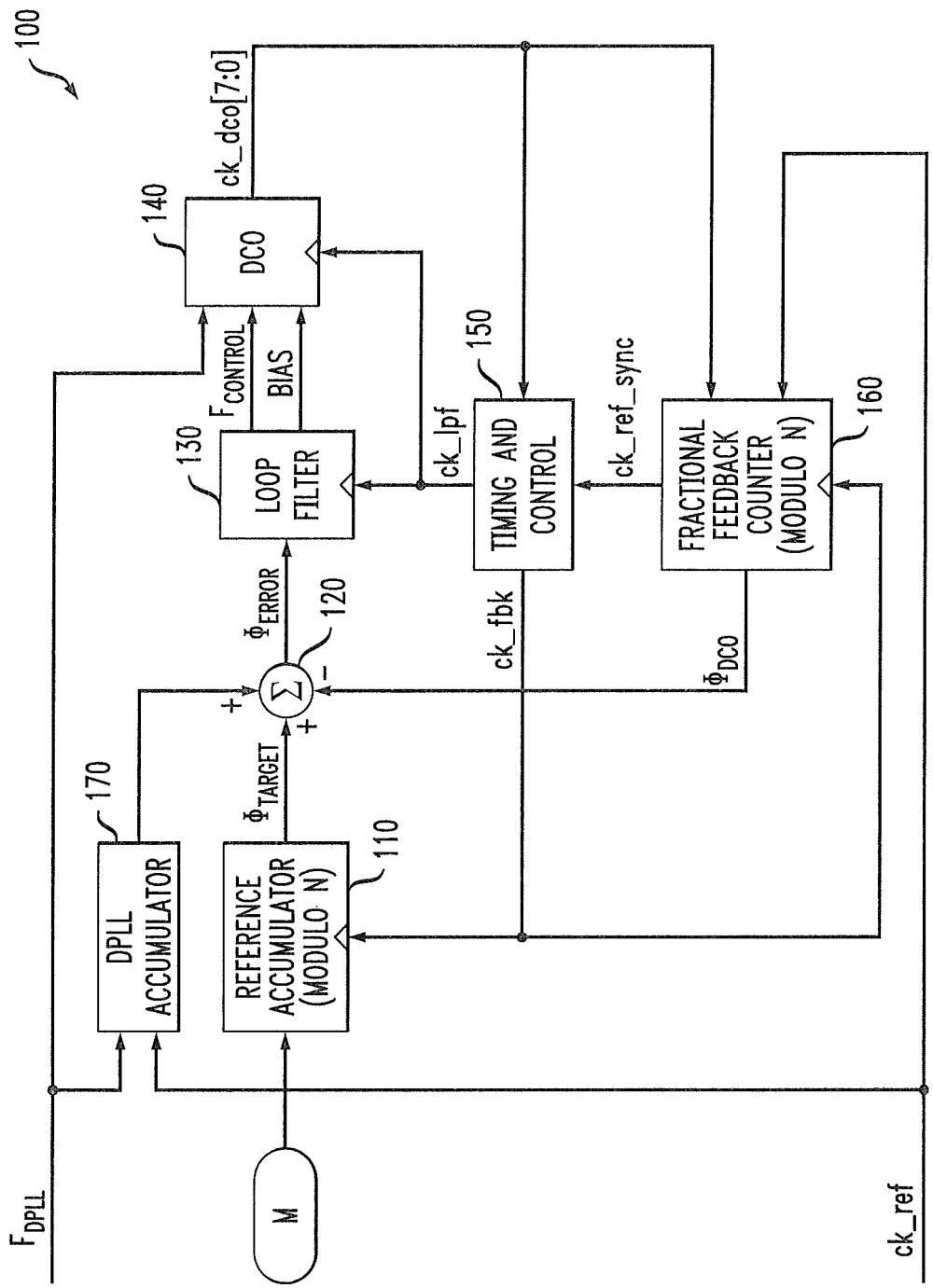
FIG. 1 illustrates a digital phase locked loop circuit according to one embodiment of the invention.

Referring initially to FIG. 1, a digital PLL according to one embodiment of the invention is shown. The digital PLL 100 of FIG. 1 comprises the following elements operatively coupled as shown: a reference accumulator 110, a difference calculator 120, a loop filter 130, a digitally controlled oscillator (DCO) 140, a timing and control unit 150, a fractional feedback counter 160 and a digital PLL accumulator 170.

It is to be appreciated that each element depicted in FIG. 1 (as well as the subsequent figures) comprises circuitry capable of performing the function(s) the element is designed to perform. However, two or more elements can share circuitry. Also, while the elements are shown as individual blocks in FIG. 1 (as well as the subsequent figures), it is to be understood that certain discrete elements illustrated and described herein can be combined into one element. One of ordinary skill in the art will fully understand how to implement the circuitry of each element of DPLL 100 given the detailed explanation of the operational interconnection and functionality of the various elements of the architecture, which will now be given.

In one embodiment, DCO 140 is a wide band tunable oscillator utilizing an 8-phase current-starved ring oscillator to generate an eight phase clock. Eight phases are merely exemplary and, thus, the number of phases can be greater or less than eight in alternative embodiments. The eight phase clock generated by DCO 140 is connected to an input of fractional feedback counter 160 via signal lines ck_dco[7:0]. Fractional feedback counter 160 outputs a digital value, $\Phi_{DCO}$, which is compared in difference calculator 120 once every reference clock cycle, ck_ref, with a phase-target, $\Phi_{target}$, generated from reference accumulator 110. In accordance with this phase comparison operation, difference calculator 120 generates error value, $\Phi_{error}$.

Based on the error value, $\Phi_{error}$, between the feedback counter value, $\Phi_{DCO}$, and the phase-target, $\Phi_{target}$, an adjustment value is computed using loop filter 130 to produce a new digital control word, Fcontrol, for the DCO 140. Both fractional feedback counter 160 and reference accumulator 110 roll over through zero once they reach their maximum value of $2^{N-1}$ (modulo N).

The difference calculator 120 also uses modulo N arithmetic such that if either the reference accumulator 110 or fractional feedback counter 160 rolls over before the other, the difference is still a relatively small number. Reference accumulator 110 increments by a value of M once every cycle of the reference clock. M can have arbitrarily fine precision to produce accurate frequency control for the digital PLL 100. In one embodiment, M is a binary number including eight integer bits and thirty one fractional bits. The value of M determines the frequency of the digital PLL 100, wherein the output frequency will be M*Fref, where Fref is the frequency of clock signal ck_ref.

By way of example, the digital PLL 100 described herein is advantageously distinct from existing PLL architectures in that the difference calculator does not compare the time difference between a reference edge transition and an edge generated by dividing down the VCO clock. In the embodiment of FIG. 1, the difference calculator 120 compares the digital value of the phase target which is computed by reference accumulator 110 and the value of fractional feedback counter 160 which is continuously counting the number of DCO cycles that have elapsed since the circuit was powered up. Thus, in contrast to existing techniques for fractional PLLs that use a digital adaptation of a more traditional analog architecture, the techniques implemented in the architecture of DPLL 100 reduce the number of sources of quantization noise and are readily adaptable to time-to-digital conversion (TDC) techniques for further reducing the amount of quantization noise injected by the feedback counter.

Timing and control unit 150 receives a clock output ck_dco [0] from DCO 140 (i.e., one phase of the DCO output) and a ck_ref_sync signal derived from fractional feedback counter 160. Timing and control unit 150 updates the reference accumulator 110 and samples the fractional feedback counter 160 with a clock signal, ck_fbk, which is a sufficiently delayed version of ck_ref to allow for a settling time for the fractional feedback counter 160. Timing and control unit 150 also generates a clock signal, ck_lpf, which is a sufficiently delayed version of ck_ref to allow for a settling time for the loop filter 130 calculations.

Loop filter 130 receives signal $\Phi_{error}$ from difference calculator 120. The loop filter performs standard proportional and integral gain calculations and an additional calculation for producing the bias control signal (Bias) for DCO 140. Since the DCO is trimmed to produce a constant percentage change in frequency per change in digital-to-analog conversion (DAC) value (described below in the context of FIG. 7), the proportional and integral gain values are adjusted to maintain a constant loop-bandwidth at all operating frequencies. Furthermore, in one embodiment, the proportional and integral gain adjustments have sufficient range to vary the loop-bandwidth over a range from about 375 kHz to about 4 MHz. Loop filter 130 uses the results of the proportional and integral gain calculations to generate signal $F_{control}$ used by DCO 140 to control a digital-to-analog converter (DAC) as will be described below in the context of FIG. 7.

The elements as arranged in FIG. 1 can be viewed as collectively comprising one possible example of "PLL (or DPLL) circuitry," "control circuitry" or, more generally, "circuitry," as such phrases are used herein. Numerous alternative arrangements of circuitry can be used in other embodiments, and such arrangements can include a subset of the elements in FIG. 1, or portions of one or more of these components.

Furthermore, the term "circuitry" is to be understood to generally encompass discrete circuit elements, processor devices under control of program code, integrated circuits or portions thereof, and/or the like.

Figure 2:
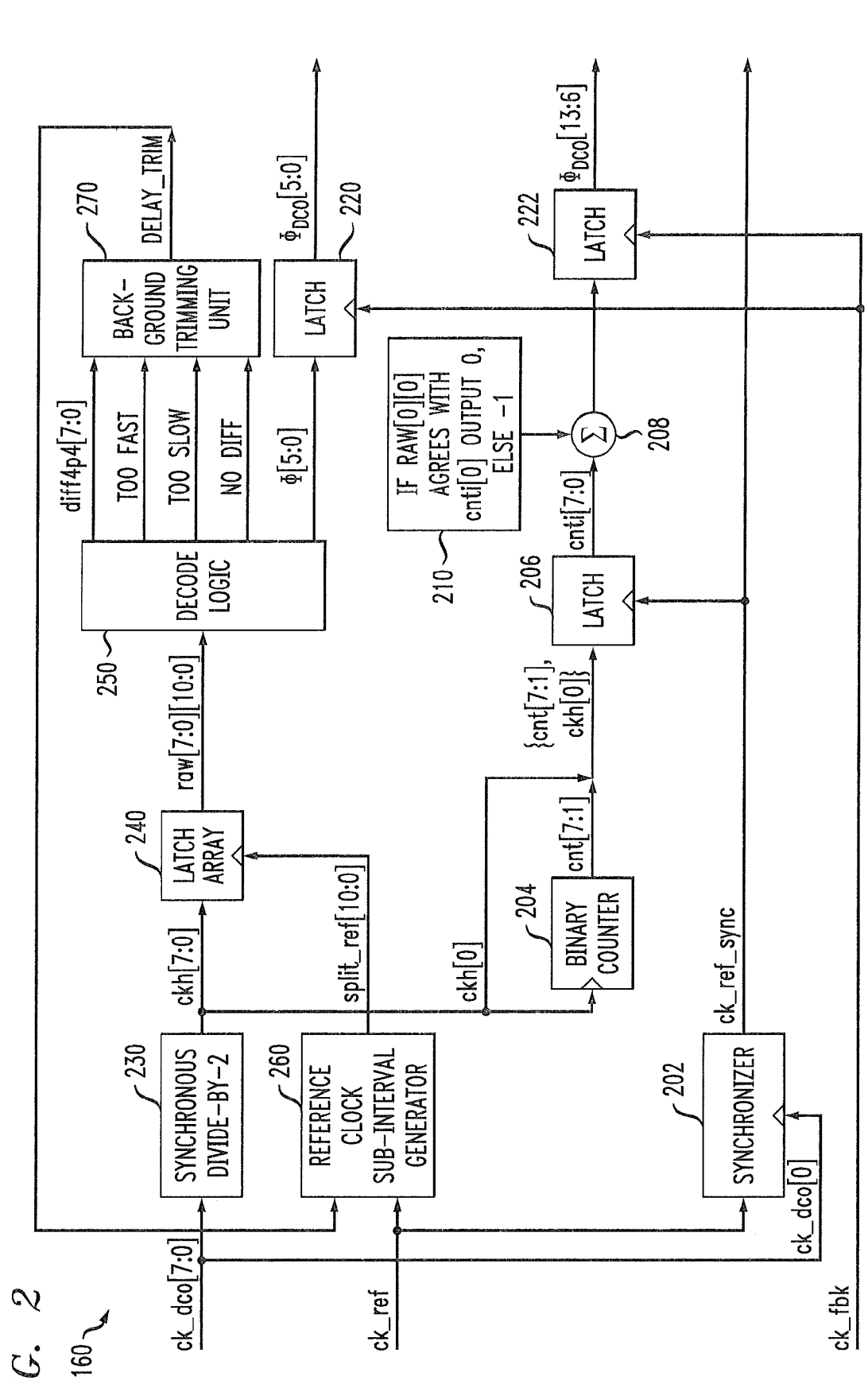
FIG. 2 illustrates a fractional feedback counter according to one embodiment of the invention.

Turning now to FIG. 2, one embodiment of the fractional feedback counter 160 of FIG. 1 is shown. It is to be understood that alternative implementations of a fractional feedback counter can be realized given the illustrative teachings provided herein. As will be explained, the counter 160 employs a fractional phase detection methodology according to one embodiment of the invention.

As depicted, the fractional feedback counter 160 comprises a synchronizer 202, a binary counter 204, a first latch 206, a summer 208, a decision unit 210, a second latch 220, a third latch 222, a synchronous divide-by-two unit 230, a latch array 240, decode logic 250, a reference clock sub-interval generator 260, and a background trimming unit 270.

The methodology of the fractional feedback counter 160 as depicted in FIG. 2 performs three main functions. The first function is that of an integer counter for detecting the DCO phase over a range of $2^N$ cycles, wherein the cycles are tracked by the integer counter function. The second function is that of a fractional detector for detecting the state of an 8-phase DCO at the instant of a ck_ref clock edge. The third function is that of a sub-fractional detector employing a time-to-digital converter to measure when the ck_ref clock edge occurs relative to the most recent DCO transition. It should be understood that although the embodiment as described includes all three functions, embodiments can be realized with a subset of these functions, for example, an embodiment with an integer counter alone, or an embodiment with an integer counter and a fractional detector but no sub-fractional detector.

The integer counter function of the fractional feedback counter 160 is mainly distributed across units 230, 204 and 206 in FIG. 2. The synchronous divide-by-two unit 230 uses ck_dco[0] of the DCO clock (generated by DCO 140 of FIG. 1) to generate the least significant bit of the counter, ckh[0]. The remaining bits cnt[7:1] of the N-bit binary counter are generated by binary counter 204, which is a ripple type counter that increments its state on each negative transition of ckh[0]. The integer counter function increments once every cycle of the DCO 140 and, upon reaching its maximum value, rolls over to a value of zero and continues counting (modulo N). The value of the integer counter {cnt[7:1], ckh[0]} is sampled by latch 206 on the rising edge of ck_ref after it has been synchronized to the counter clock, ck_dco[0], by synchronizer 202. Synchronizer 202 prevents the sampling of the counter while it is in a transitional state. However, this introduces a one count uncertainty in the value cnti[7:0] that is stored in latch 206.

Figure 3:
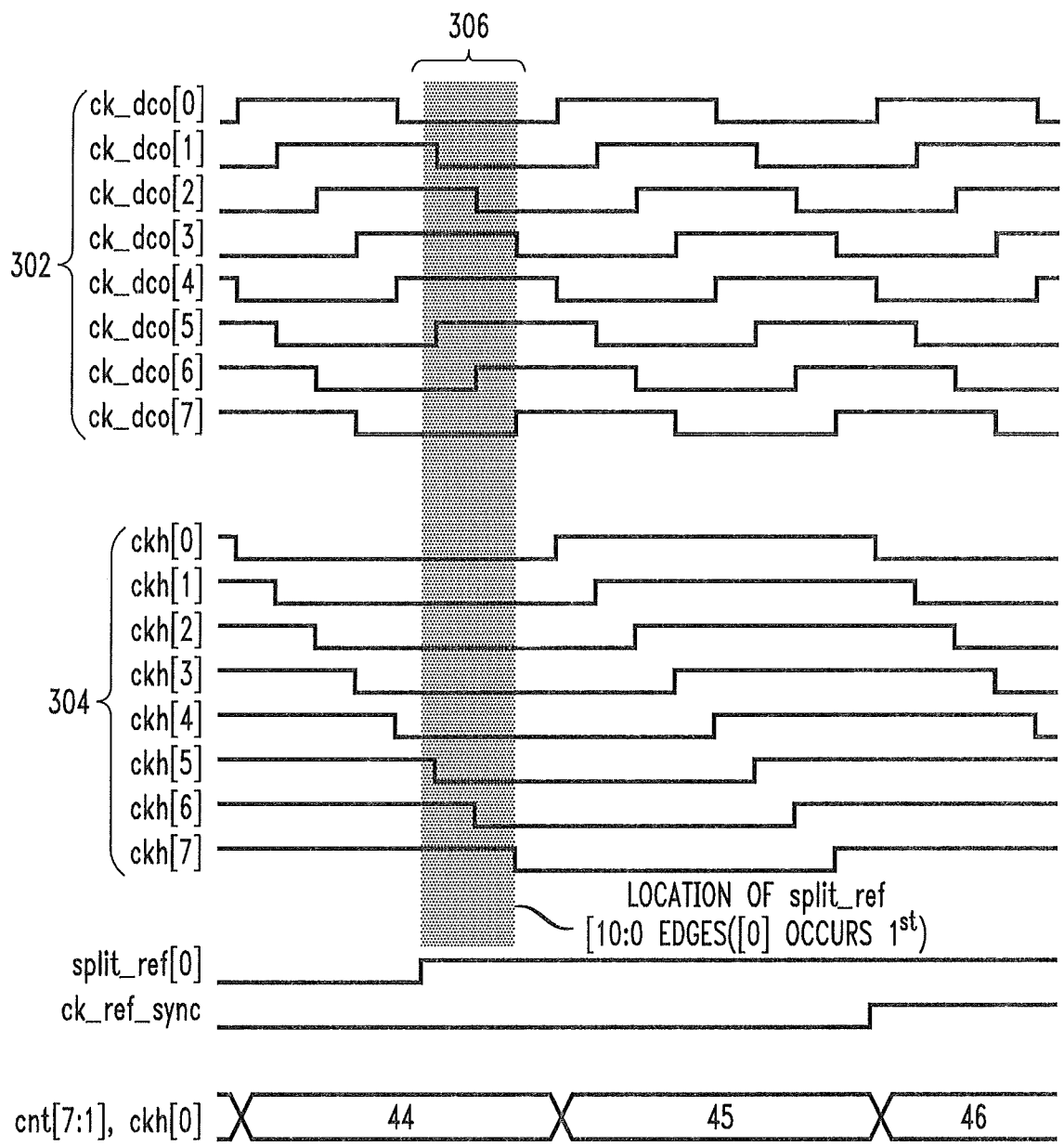
FIG. 3 illustrates waveforms associated with a fractional feedback counter according to one embodiment of the invention.

The fractional detector function of the fractional feedback counter 160 determines the state of the DCO 140 on the rising edge of ck_ref and is also used to resolve the one count uncertainty introduced by synchronizer 202. With reference to FIG. 3, synchronous divide-by-two unit 230 receives the 8-phase clock ck_dco[7:0] from DCO 140 (referenced as 302 in FIG. 3) and divides each clock phase by two to produce eight half-rate clocks, ckh[7:0] (referenced as 304 in FIG. 3), each having a relative phase separation equal to half the separation between the input clocks, ck_dco[7:0]. For example, if ck_dco[0] represents a phase of 0°, ck_dco[1] is −45°, ck_dco[2] is −90°, and so forth, then at half the rate, ckh[0] would represent a phase of 0°, ckh[1] is −22.5°, ckh[2] is −45°, and so forth. Eight latches within an 8×11 array in latch array 240 receive divided clock ckh[7:0] from synchronous divide-by-two unit 230, wherein divided clock ckh[7:0] is latched by reference clock signal split_ref[0] from reference clock sub-interval generator 260 and presented at the output of latch array 240 as signal raw[7:0][0]. Split_ref[0] is essentially the same as ck_ref, however, as will be explained, in order to generate small time delays between the phases of split_ref[10:0], split_ref[0] is delayed by several gate-delays relative to ck_ref.

Figure 4:
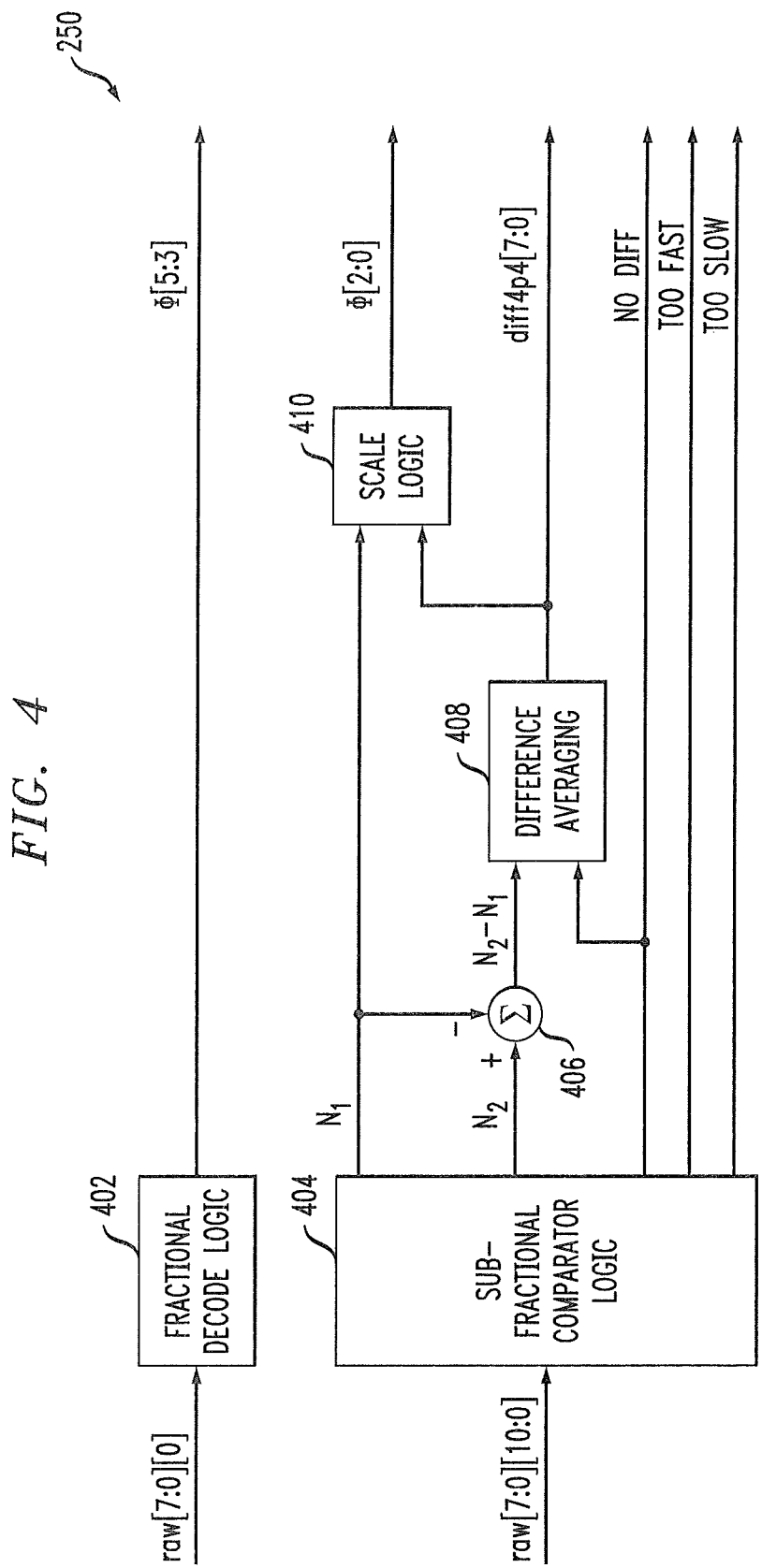
FIG. 4 illustrates decode logic associated with a fractional feedback counter according to one embodiment of the invention.

One embodiment of decode logic 250 of the fractional feedback counter 160 is shown in FIG. 4. As shown, decode logic 250 contains fractional decode logic 402 that determines the fractional phase of the DCO 140 by processing raw[7:0][0] to produce $\Phi_{DCO}[5:3]$ according to TABLE 1 below. The even/odd state of the fractional detector is determined from the bit raw[0][0].

TABLE 1

Fractional Detector Decode Logic

| raw[7:0][0] | $\Phi_{DCO}[5:3]$ |
|---|---|
| 00000001 | 000 (odd) |
| 00000011 | 001 (odd) |
| 00000111 | 010 (odd) |
| 00001111 | 011 (odd) |
| 00011111 | 100 (odd) |
| 00111111 | 101 (odd) |
| 01111111 | 110 (odd) |
| 11111111 | 111 (odd) |
| 11111110 | 000 (even) |
| 11111100 | 001 (even) |
| 11111000 | 010 (even) |
| 11110000 | 011 (even) |
| 11100000 | 100 (even) |
| 11000000 | 101 (even) |
| 10000000 | 110 (even) |
| 00000000 | 111 (even) |

Thus, in accordance with synchronous divide-by-two unit 230 and latch array 240, both the state of the 8-phase clock ck_dco[7:0] from DCO 140 and the proper even/odd state of the integer counter (to resolve the aforementioned uncertainty introduced by synchronizer 202) are determined at the instant of a reference clock transition.

The sub-fractional detector function of the fractional feedback counter 160 uses a time-to-digital conversion (TDC) technique to latch the state of the 8-phase DCO clock at multiple sub-intervals after the reference clock edge in order to estimate the DCO phase with a finer (sub-fractional) resolution than otherwise possible based on just the fractional phase detector function. The sub-fractional detector function operates by repeating the function of the fractional detector at multiple sub-intervals after the initial split_ref[0] edge. Reference clock sub-interval generator 260 generates ten delayed copies of split_ref[0], each being delayed by approximately $1/64^{th}$ of a DCO clock cycle relative to the previous copy. Latch array 240 captures eleven snapshots of the 8-phase DCO state and presents these at its output signal, raw[7:0][10:0]. Beginning with raw[7:0][1], decode logic 250 sequentially compares the ten delayed snapshots against raw[7:0][0] to locate the first one, raw[7:0][N$_1$], that is different from the DCO state represented by raw[7:0][0]. If the state changes a second time in snapshot raw[7:0][N$_2$], it too is noted. Furthermore, if the eleven snapshots capture the DCO changing state twice, then, on average, the distance between the state changes represents the number of sub-intervals between two adjacent DCO phases.

For example, if the DCO changes state between raw[7:0][0] and raw[7:0][1] (N$_1$=1) and then changes again between raw[7:0][8] and raw[7:0][9] (N$_2$=9), then the distance between state changes is N$_2$−N$_1$=8 and therefore the time between each sub-interval is $1/(N_2-N_1)=1;8^{th}$ of the time between adjacent phases of the 8-phase DCO. Finally, decode logic 250 computes the sub-fractional phase using the formula $\Phi_{DCO}[2:0]=\text{round}(8\cdot[\text{avg}(N_2-N_1)-N_1]/\text{avg}(N_2-N_1))$ to produce a self-calibrating phase measurement that is insensitive to the exact amount of delay between the split_ref[10:0] sub-intervals.

Thus, the sub-fractional detector function, as implemented in decode logic 250, includes a self-calibration method. The method utilizes the total time-interval spanned by a number of sub-intervals, generated by the reference-clock sub-interval generator 260 in the form of the signals, split_ref[10:0], illustrated in FIG. 3 by vertical dashed lines (referenced as 306), to occasionally exceed the time-interval between adjacent DCO phases (e.g., between ckh[5] and ckh[6] as shown in FIG. 3) so that the number of sub-intervals that occur between adjacent DCO phases can be occasionally measured. Then, regardless of the absolute spacing between sub-intervals, an absolute phase is determined by dividing the number of sub-intervals between split_ref[0] and a DCO phase transition by the number of sub-intervals between DCO phase transitions.

The self-calibration method is explained in more detail through the further use of FIGS. 3 and 4. FIG. 3 represents one exemplary alignment of the reference clock (split_ref[0]) and the DCO phase (ckh[0]) that allows the interval between adjacent DCO phases to be quantified. Other alignments are possible. The process begins with the rising edge of split_ref [0] which captures the initial state of ckh[7:0] as a binary value of 11100000. This value is stored in raw[7:0] [0]. Next, after a first sub-interval determined by split_ref[1], the state of ckh[7:0] is again sampled and, although it remains unchanged, is stored in raw[7:0][1]. After a second sub-interval determined by split_ref[2], the state of ckh[7:0] changes to a value of 11000000 and is stored in raw[7:0] [2]. The process continues until the tenth sub-interval determined by split_ref[10] when the state of ckh[7:0] changes to 10000000 and is stored in raw[7:0][10].

Next, as shown in the circuitry of FIG. 4 (which is part of decode logic 250), sub-fractional comparator logic 404 sequentially compares the values of raw[7:0][10:0] to determine when a first ($N_1$) and second ($N_2$) change occurred according to the following pseudo-code:

```
N1=N2=too_slow=too_fast=no_diff=0;
for (n=1; n<=10; n=n+1) {
    if (raw[7:0] [n] != raw[7:0] [n−1] && N1!=0 && N2!=0) too_slow=1;
    if (raw[7:0] [n] != raw[7:0] [n−1] && N1!=0 && N2==0) N2=n;
    if (raw[7:0] [n] != raw[7:0] [n−1] && N1==0) N1=n;
}
if ( N2 == 0 and N1>2 ) no_diff=1;
if ( N1 == 0 ) too_fast=1;
```

The difference between $N_2$ and $N_1$ is computed in difference calculator 406. Difference averaging unit 408 uses the difference between values of $N_1$ and $N_2$ to compute the average number of sub-intervals that span adjacent DCO phases. In the embodiment shown, the average difference is computed to four binary decimal places using the following recursive formula that gets executed once every reference clock cycle:

```
if ( no_diff == 0 ) {
    if (N2 > 0) diff4p4 [7:0] =15/16*diff4p4 [7:0] + (N2−N1);
    else if (N1 == 2) diff4p4[7:0] =15/16*diff4p4[7:0] +9;
    else if (N1 == 1) diff4p4[7:0] =15/16*diff4p4[7:0] +10;
}
```

In this formula, the quantity $N_2-N_1$ is effectively divided by 16 and added to 15/16 of the previous average to produce an exponential moving average of the difference. In the event that $N_1$ is two but a second state change ($N_2$) is not detected, then the difference between DCO phases must be greater than eight sub-intervals, so an approximate value of nine is assumed. This doubles the chances of measuring a difference of nine and improves the robustness of this embodiment of the method when split_ref has only eleven phases. Similarly, if $N_1$ is one but a second state change ($N_2$) is not detected, then the difference between DCO phases must be greater than nine sub-intervals, so an approximate value of ten is assumed. The final step in the computation of the sub-fractional phase is handled in scale logic unit 410 which normalizes the value of $N_1$ to an absolute phase with the equation:

```
φ[2:0] = round (8* (diff4p4 [7: 0] −16*N1) /diff4p4 [7:0]) ;
if (N1==0 or 16*N1>diff4p4 [7:0]) φ[2:0] =0;
```

Returning reference to FIG. 2 now, de-synchronization of the integer counter value with the fractional and sub-fractional phase values can occur when the rising edge of split_ref [0] occurs nearly coincident with the rising edge of ckh[0]. Under this condition, the state of raw[0] [0] coming from latch array 240 is determined by extremely small timing differences between split_ref[0] and ckh[0]. Likewise, under the same conditions, the generation of the ck_ref_sync rising edge may or may not be delayed by one clock cycle because the synchronizer 202 can make a decision differently than the latch in latch array 240 that generates the raw[0] [0] signal. If this happens, the even/odd state of the integer counter may not agree with the even/odd state as captured by raw[0][0].

The fractional feedback counter 160, represented in FIG. 2, synchronizes the integer counter value with the fractional and sub-fractional phase values. This is accomplished in accordance with three operations. First, an intentional timing skew is introduced into the synchronizer 202 such that, when the rising edge of split_ref[0] is exactly lined up with a transition on ckh[0] (the meta-stable point for the latch in latch array unit 240 that determines whether the phase $\Phi_{DCO}[5:3]$ will be 111 or 000), the rising edge of synchronizer 202 clock, ck_dco[0], will always precede the rising edge of ck_ref, the input to synchronizer 202. With this done, the integer counter will tend to increment by one before the fractional detector rolls the phase from 111 to 000.

Next, the range of the fractional detector is extended to cover two full cycles of the DCO clock through the use of synchronous divide-by-2 unit 230 which, when latched by latch array 240, produces a pattern in raw[7:0][0] that allows an even and odd count to be distinguished as shown in TABLE 1 above.

Finally, the decision unit 210 compares the value of raw[0] [0] with cnti[0], the LSB output of latch 206 and, if they are not in agreement, then a value of one is subtracted from cnti[7:0] by summer 208. The phrase "not in agreement" could mean the two bits are different or could also mean the two bits are the same. This will depend on whether the synchronizer 202 is a two-stage or three-stage synchronizer and on whether the ck_ref_sync is aligned to load data into latch 206 immediately after or before the binary counter 204 is incremented.

The waveforms as presented in FIG. 3 assume a two-stage synchronizer and that the value of {cnt[7:1], ckh[0]} is latched into cnti[7:0] immediately before the data changes. In this case, cnti[0] and raw[0] [0] will normally be different except near the meta-stable region of the raw[0] [0] latch. When the two bits are the same, then they are no longer "in agreement," meaning no longer conforming to their normal state, and a value of one is subtracted from cnti[7:0].

A background trimming algorithm unit 270 of FIG. 2 adjusts the sub-interval delay produced by the reference clock sub-interval generator 260 using the control delay_trim to achieve a desired target value for diff4p4[7:0]. It is to be understood that the term "algorithm," as used herein, is understood to encompass program code that is configured to perform specific methods, steps and/or functions described herein, and that is loaded and executed by appropriate circuitry (e.g., discrete circuit elements, processor devices, integrated circuits and/or the like) in order to realize the specific methods, steps and/or functions.

The method of trimming can depend on the value of diff4p4[7:0]. For example, if the value of diff4p4[7:0] is significantly greater than the target for diff4p4[7:0] and the value of diff4p4[7:0] has been updated at least CNT_DIFF times since the last change in the trim value, as determined by the repeated absence of a no_diff assertion, then unit 270 increments delay_trim, thereby shortening the sub-interval. If the value of diff4p4[7:0] is significantly less than the target for diff4p4[7:0] and the value of diff4p4[7:0] has been updated at least CNT_DIFF times since the last change in the trim value, then unit 270 decrements the trim value, thereby lengthening the sub-interval.

In addition, if the sub-fractional phase detector function detects no transitions in the DCO clock over the entire interval spanned by the reference clock sub-intervals, as indicated by the too_fast signal from decode logic 650, then unit 270 decrements the trim value, thereby lengthening the sub-interval. However, if the sub-fractional phase detector function detects more than two transitions in the DCO clock over the entire interval spanned by the reference clock sub-intervals, as indicated by the too_slow signal from decode logic 650, then unit 270 increments the trim value, thereby shortening the sub-interval.

In one embodiment, the target value for diff4p4[7:0] is a binary value of 10000000 (four integer bits and four fractional bits) which corresponds to eight sub-intervals between adjacent DCO phases, and "significantly less than or greater than" consists of a tolerance of ±0.25 sub-intervals, although this number can be adjusted. The maximum value of diff4p4[7:0] that can be detected by the fractional detector function is ten sub-intervals, a value chosen to minimize the number of differential delay cells required in the embodiment. The values of the sub-interval delay can be trimmed in increments of nominally 3%. CNT_DIFF is set to sixteen.

Figure 5:
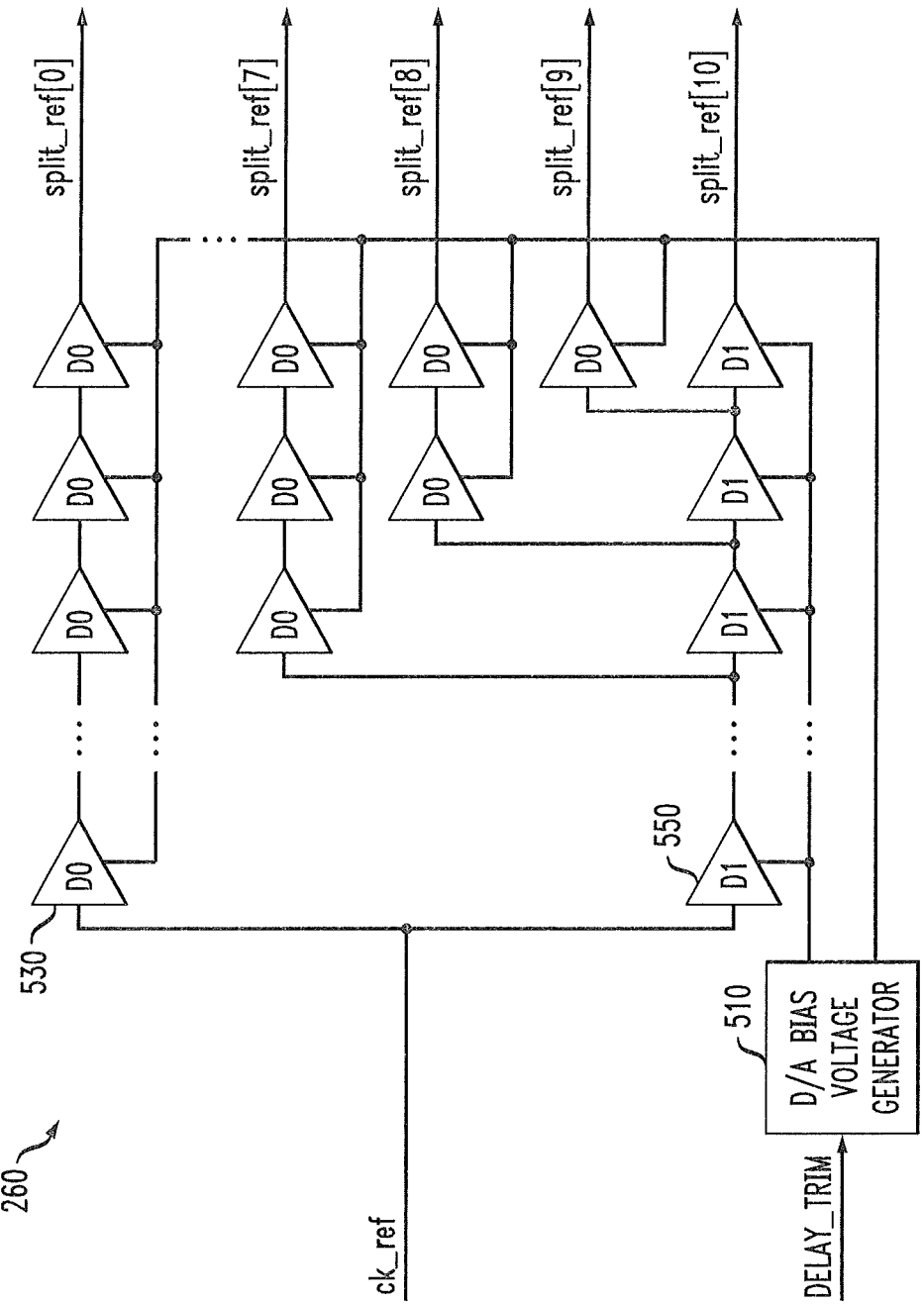
FIG. 5 illustrates a reference clock sub-interval generator according to one embodiment of the invention.

Turning now to FIG. 5, one embodiment of the reference clock sub-interval generator 260 of FIG. 2 is shown. It is to be understood that alternative circuit implementations of a reference clock sub-interval generator can be realized given the illustrative teachings provided herein.

Reference clock sub-interval generator 260, shown in FIG. 5, uses differential biased current-starved delay cells to achieve a widely tunable delay range. The delay cells, 530 and 550, are substantially identical in construct. The D0 cells, 530, give a fixed delay on the order of about 15 picoseconds (ps), although it is advantageous under some conditions to intentionally slow the D0 cells slightly in order to reduce the delay difference between the D0 and D1 cells. The D1 cells, 550, are biased to give a delay that is longer than the D0 cells by an amount equal to approximately $1/64^{th}$ of the DCO period. The delay is controlled by a D/A bias voltage generator circuit 510 which converts a digital control word, delay_trim, into an analog voltage for the delay cells, 530 and 550, through the use of a scalable gate-drain connected MOS (metal oxide semiconductor) device with a fixed bias current. The delay between any two adjacent split_ref[ ] signals, for example, split_ref[9] and split_ref[10], will be equal to the difference, D1–D0, between two differentially biased delay cells. In this manner, the sub-interval delay can be trimmed to cover a DCO operating frequency range from about 350 MHz to about 5 GHz with delay values, D1–D0, that range from about 45 ps down to about 3 ps.

Figure 6:
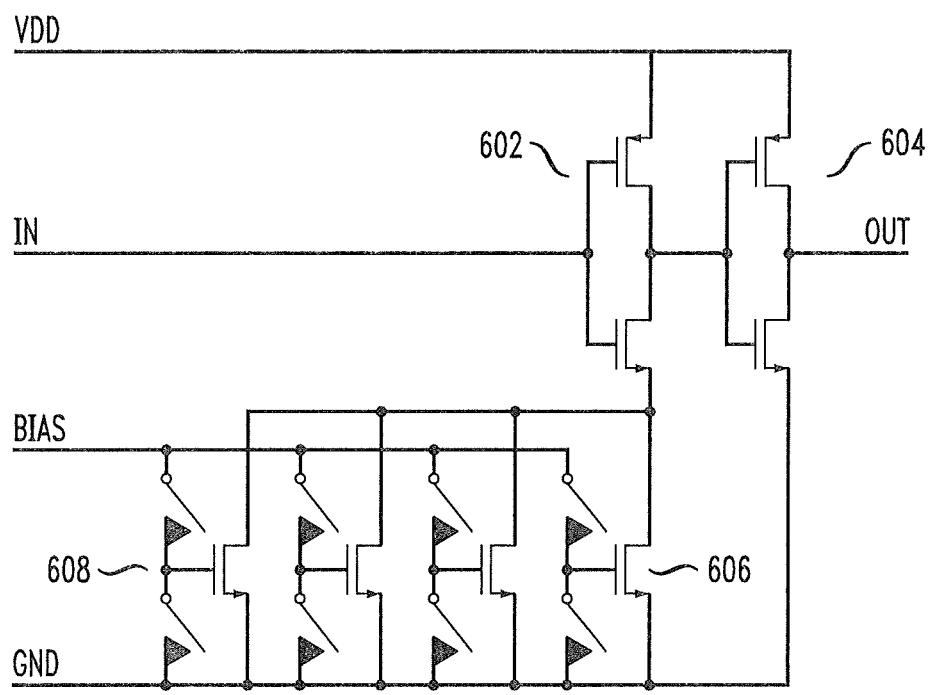
FIG. 6 illustrates a sub-interval delay cell according to one embodiment of the invention.

FIG. 6 illustrates one embodiment of delay cells 530 and 550 shown in FIG. 5. Note that while elements in the figure are shown as either negative-type MOS (NMOS) devices or positive-type MOS (PMOS) devices, one ordinarily skilled in the art will realize how the delay cell could be implemented with each element being implemented with the opposite type of MOS device.

Both the fixed delay (D0) and variable delay (D1) instantiations of the cell are substantially identical and include a current starved inverter unit 602 on the input and a normal inverter unit 604 on the output. The current source 606 for the current starved inverter is scaled using multiple switches 608 (for the D1 instantiations) in order to more readily cover a frequency range of about 350 MHz to about 5 GHz. The overall frequency has been divided into four frequency ranges such that one transistor of current source 606 is enabled for frequencies below about 544 MHz, two transistors are active for frequencies between about 544 MHz and about 864 MHz, three for frequencies between about 864 MHz and about 1472 MHz, and all four transistors are active for frequencies above about 1472 MHz. For the D0 instantiations, all four transistors of current source 606 are always active. The design of the delay cell has been optimized to allow for adjustment of the rising edge transitions.

The current source transistors 606 all have equal width and length in order to minimize area and improve matching between the multiple delay cell instantiations. Since this results in a 2:1 current ratio when switching from the lowest operating frequency range (one transistor 606 is active) to the next highest (two transistors are active), this places the largest constraint on the tuning range required by the D/A bias voltage generator unit 510. In order to ease this constraint, the bias voltage for the D0 instantiations of FIG. 5 is lowered, resulting in a slight increase in the delay of these cells, when operating in the slowest frequency range (below about 544 MHz). An alternate approach is to reduce the scale of the current source transistors 606 in the D0 instantiations. It is also to be appreciated that the above-mentioned current ratio can be realized in alternative embodiments by activating one or more other transistor combinations.

Returning reference once again to FIG. 2, note that clock signal ck_fbk is sufficiently delayed relative to clock signals ck_ref and ck_ref_sync to allow time for data to propagate through the feedback counter 160 before the results are latched in latches 220 and 222.

Figure 7:
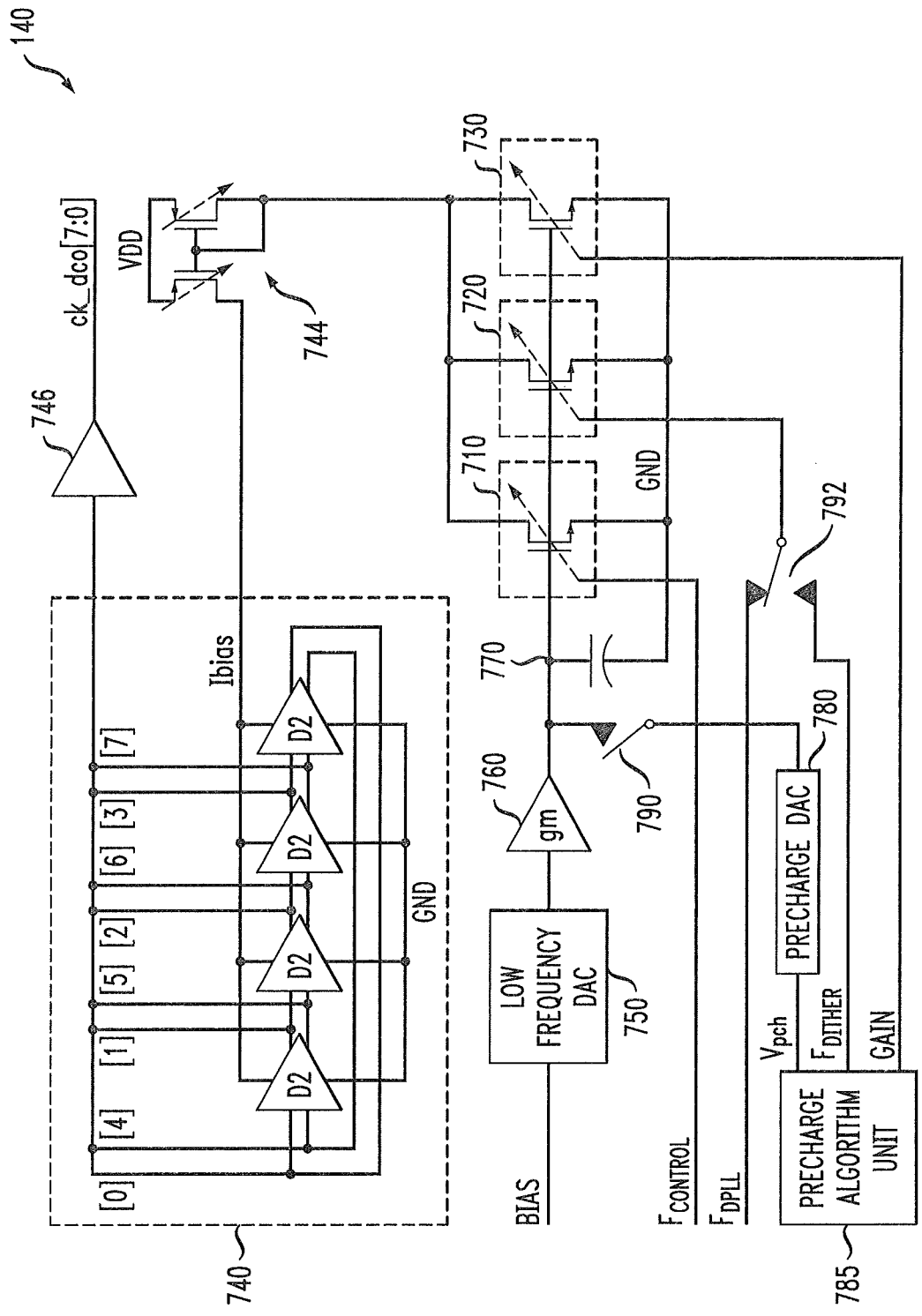
FIG. 7 illustrates a digitally controlled oscillator employing a plurality of current starved inverters for clock generation according to one embodiment of the invention.

Referring now to FIG. 7, one embodiment of DCO 140 of FIG. 1 is shown. Recall that DCO 140 provides the 8-phase clock signal, ck_dco[7:0], to the fractional feedback counter 160, as shown in FIG. 1.

As shown in FIG. 7, DCO 140 comprises a first DAC 710, a second DAC 720, a third DAC 730, a ring oscillator 740, a current mirror 744, an output buffer 746, a low frequency DAC 750, a transconductance (Gm) amplifier 760, a bias capacitor 770, a precharge DAC 780, a precharge algorithm unit 785, a first switch 790 and a second switch 792.

DCO 140 uses a low-noise quiescent DCO bias current methodology to control the clock frequency generated by ring oscillator 740. A low frequency control loop adjusts the charge on bias capacitor 770, which controls the gate to source voltage of the MOS devices used for the DCO DACs 710, 720, and 730. Low frequency DAC 750 adjusts the amount of trickle current that is dumped by transconductance amplifier 760 onto the bias capacitor 770. In an illustrative embodiment, low frequency DAC 750 comprises a 9-bit DAC with an output LSB of about 500 microVolts (uV) but selectable between values of about 125 uV, 250 uV, 375 uV and 500 uV. Gm amplifier 760 has a transconductance set to nominally about 415 nanoAmps perVolt (nA/V) but selectable to values of about 155 nA/V, 290 nA/V, 415 nA/V and 530 nA/V. Bias capacitor 770 has a capacitance of about 25 pF.

The low-frequency loop control methodology keeps the first DCO DAC 710 on average, centered near its midpoint. Besides the previously mentioned low-frequency DAC 750, Gm amplifier 760 and bias capacitor, 770, the low-frequency loop control also includes circuitry within loop filter 130 (FIG. 1) that uses the signal applied to the first DCO DAC, Fcontrol, to determine a first and second gain factor according to the following z-domain equation to produce the Bias control signal applied to the low-frequency DAC 750:

$$\text{Bias} = F_{control} \cdot 2^{(cp1gain-3)} \cdot (1 + 2^{(cp2gain-13)} \cdot Z^{-1}/(1+z^{-1}))$$

Gain factors cp1gain and cp2gain are independently adjustable over a range of 0 to 3 and the sampling interval for the z-domain is one over the reference clock frequency.

DCO 140 uses precharge DAC 780 and switch 790 to allow the voltage on bias capacitor 770 to be quickly adjusted under control of precharge algorithm unit 785 so that the DCO frequency is close to the desired target during initial frequency acquisition. The algorithm in unit 785 initiates the bias capacitor voltage at a best guess estimate of the final value given the frequency target and then iteratively searches for the optimum bias voltage based on an estimate of the frequency versus current relationship.

First DCO DAC 710 controls the scale of the low-noise quiescent DCO bias current to produce a well-controlled loop-gain for the DPLL, via control signal Fcontrol, as shown in FIG. 7. DAC 710 is integral with the low-noise quiescent DCO bias current generation method and effectively varies the size of the MOS device whose gate-to-source voltage is controlled by the low-noise quiescent DCO bias current generation method. The DAC 710 is primarily a thermometer style DAC with replicated DAC cells for good intrinsic monotonicity and low switching transients. The finest bits can be binary weighted. Furthermore, DAC 710 produces no substantial change in the supply current of the DCO regulator or charge required by the bias capacitor 770 by inclusion of a copy of the first DCO DAC that has a value that is complementary to the first DCO DAC. The current output of the copy provides an equalizing load to both the DCO regulator and the bias capacitor 770, but does not control the DCO frequency.

In one embodiment, DCO DAC 710 includes 144 thermometer DAC cells with a 3-bit binary weighted LSB DAC. DAC 710 is normally biased near mid-scale and in the absence of any current from the gain DAC 730 is capable of modifying the VCO bias current by about ±11%. After gain calibration, DAC 710 adjusts the DCO frequency by up to about +7% with a resolution of about 0.0122%.

Second DCO DAC 720 is used for fast frequency and/or phase adjustments to the DPLL, via the control signal Fdpll, as shown in FIG. 7. DAC 720 is integral with the low-noise quiescent DCO bias current generation method and effectively varies the size of the MOS device whose gate-to-source voltage is controlled by the low-noise quiescent DCO bias current generation method. DAC 720 has a thermometer DAC cell structure that is a replica of the first DCO DAC 710. DAC 720 produces no substantial change in the supply current of the DCO regulator or charge required by the bias capacitor 770 by inclusion of a copy of the second VCO DAC that has a value that is complementary to the second VCO DAC. The current output of the copy provides an equalizing load to both the DCO regulator and the bias capacitor 770, and does not control the DCO frequency. In one embodiment, DCO DAC 720 includes 64 thermometer DAC cells and is normally biased at mid-scale. In the absence of any current from the gain DAC 730, DAC 720 is capable of modifying the VCO bias current by about ±4.9%. After gain calibration, DAC 720 adjusts the DCO frequency by up to about ±3.125% with a resolution of about 0.0977%.

Note also that the DPLL accumulator 170, shown in FIG. 1, can adjust the DPLL phase target once every reference clock cycle to account for the accumulated phase change induced by the second DCO DAC 720 of FIG. 7 during the preceding reference clock period.

The third DCO DAC 730 in DCO 140 is used for calibrating the gain of the first and second DCO DACs 710 and 720. DAC 730 is integral with the low-noise quiescent DCO bias current generation method and effectively varies the size of the MOS device whose gate-to-source voltage is controlled by the low-noise quiescent DCO bias current generation method. DAC 730 adjusts the gain of the first and second DCO DACs by adjusting the fraction of the current controlled by the first and second DCO DACs. This calibration is part of precharge algorithm 785 which involves measuring the amount of frequency change produced by the second DCO DAC 720 (or optionally by the first DCO DAC 710) by virtue of control signal $F_{dither}$ and switch 792, and adjusting the current of the third DCO DAC 730 until the desired amount of frequency change is achieved. In one embodiment, the targeted frequency change induced by $F_{dither}$ is about ±3.125%. When the gain has been adjusted such that $F_{dither}$ produces a about ±3.125% frequency change, then the gain for $F_{DPLL}$ is about 0.09766% per LSB, and the gain for $F_{control}$ is about 0.01221% per LSB. To provide adequate trim range, the DCO DAC 730 is capable of supplying approximately as much current as the sum of the currents in the other two DACs, reducing the current gain of DCO DACs 710 and 720 by about 50%.

Figure 8:
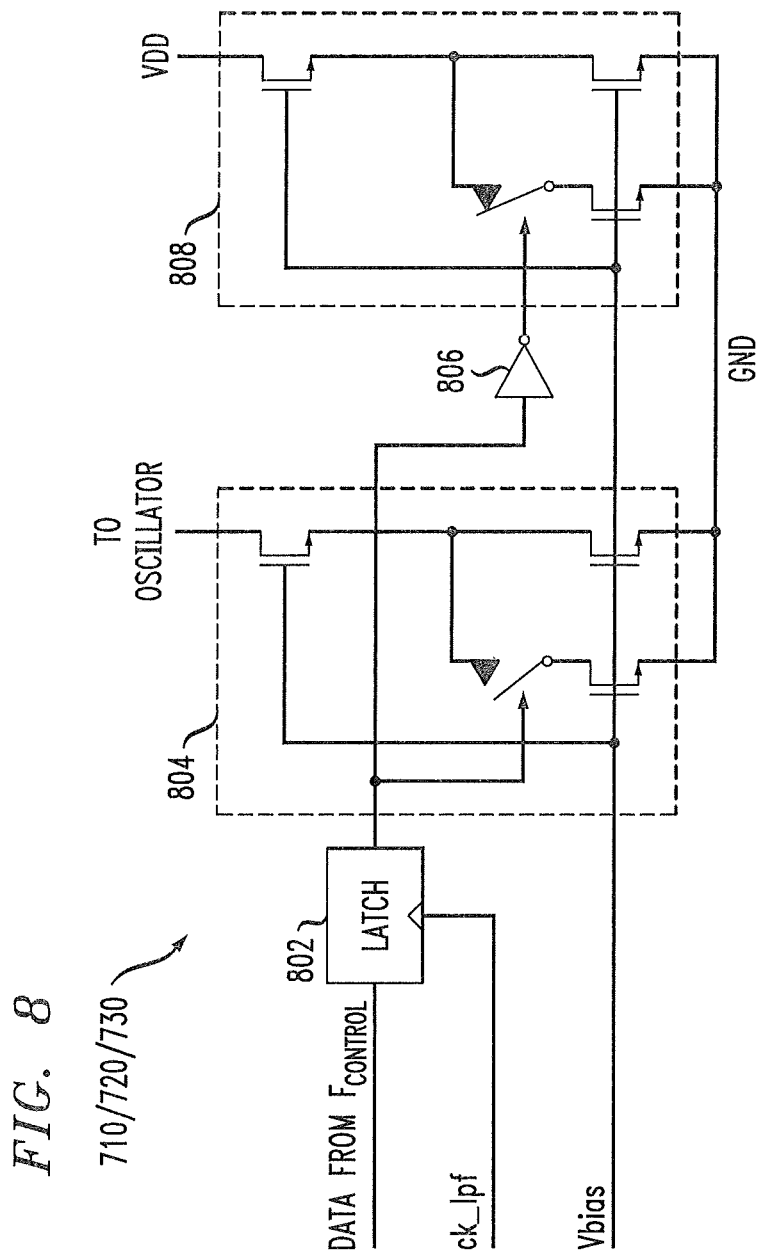
FIG. 8 illustrates one of a plurality of thermometer cells comprising a digital-to-analog converter according to one embodiment of the invention.

FIG. 8 illustrates one embodiment of one of a plurality of thermometer DAC cells comprising DCO DACs 710, 720 and 730. Each cell contains a latch 802 to ensure that data to all cells is loaded synchronously to avoid glitches. The width of composite transistor 804 can be varied between a high and low state via a transistor switch that is controlled by the latch output. In one embodiment, closing the switch in composite transistor 804 effectively increases the width by about 38%. The output of composite transistor 804 is summed with all of the other thermometer cells in DACs 710, 720 and 730 to produce the bias current for the ring oscillator 740. A duplicate 808 of composite transistor 804 is held in a complementary state via inverter 806 to compensate for charge injected onto Vbias when latch 802 switches. Similarly, duplicate composite transistor 808 partially compensates for supply current variation caused by current changes in composite transistor 804.

It is to be noted that while DAC 730 can be identical to DAC 710 and 720 in one embodiment (as depicted in FIG. 8), DAC 730 can be further simplified in an alternative embodiment. For example, since DAC 730 switches during the gain calibration phase immediately after the PLL switches to a new frequency, and because it has a much larger current range than the other two DACs, the duplicate composite 808 of the DAC can be removed, as well as the lower right transistor in composite transistor 804.

Referring back to ring oscillator 740 in FIG. 7, the ring oscillator comprises differential current-starved delay cells D2. Bussed output buffer 746 provides additional drive capacity for the 8-phase clock output of ring oscillator 740. A current bias, Ibias, used to control the current-starved delay cells D2 of ring oscillator 740 is generated by the connection of the drains of the MOS devices in DCO DACs 710, 720 and 730 to a diode connected PMOS input device of current mirror 744. Effectively varying the size of the MOS devices in DCO DACs 710, 720 and 730 controls the current bias, Ibias, which in turn controls the frequency of ring oscillator 740. In one embodiment, the current-starved delay cell D2 includes two inverters, one for each input, and a cross-coupled inverter load to reduce the common-mode gain. Ibias serves as a common supply for all four current-starved delay cells. Current mirror 744 has a programmable gain of N/32 that is set based on the nominal frequency of operation. For example, if N=2 at the lowest operating frequency, then as the operating frequency exceeds breakpoints of [480, 608, 800, 1088, 1472, 1856, 2304, 3072, 3712, 4608] MHz, N will take on values of [3, 4, 4, 6, 8, 10, 16, 20, 24, 27].

The precharge algorithm employed by unit 785 is predicated on knowing that the sum of the currents in DACs 710, 720 and 730 is directly proportional to control signal Vpch when the precharge switch 790 is closed, and also with respect to DAC 730 control, Gain, the sum of the current is approximately proportional to Gain+208/Gf, where 208 is the total number of thermometer cells in DACs 710 and 720, and Gf=1.7 is the ratio of the unit cell in DAC 730 to the thermometer cell in DACs 710 or 720. Furthermore, the frequency of the DCO 140 can be measured relative to ck_ref by taking the difference between two successive readings of the fractional feedback counter 160. One embodiment of the precharge algorithm employed by unit 785 is as follows:

1. Initialize values of Vpch=Vpch_0 and Gain=Gain_0 and set $F_{control}$ and $F_{dither}$ to midscale. Close switches 790 and 792 to connect the precharge DAC and to allow the precharge algorithm to have direct control of DCO DAC 720. Both Vpch_0 and Gain_0 come from a lookup table of best guess values for the particular operating frequency.
2. Begin the first of three iterations on Vpch by allowing the DCO 140 to settle for eight ck_ref cycles and measuring the number of DCO cycles that occur in the 9th ck_ref cycle, $F_{DCO\_0}$. Complete the iteration by setting Vpch=Vpch_1=Vpch_0·(2−$F_{DCO\_0}$/MDIV) on the $10^{th}$ ck_ref cycle.
3. Begin the second of three iterations on Vpch by allowing the DCO 140 to settle for eight ck_ref cycles and measuring the number of DCO cycles that occur in the 9th ck_ref cycle, $F_{DCO\_1}$. Complete the iteration by setting Vpch=Vpch_2=Vpch_1·(2−$F_{DCO\_1}$/MDIV) on the $10^{th}$ ck_ref cycle.
4. Begin the third of three iterations on Vpch by allowing the DCO 140 to settle for eight ck_ref cycles and measuring the number of DCO cycles that occur in the 9th ck_ref period, $F_{DCO\_2}$. Complete the iteration by setting Vpch=Vpch_3=Vpch_2·(2−$F_{DCO\_2}$/MDIV) on the $10^{th}$ ck_ref cycle and allowing another two ck_ref cycles for settling.
5. Begin the first of three iterations on Gain by setting $F_{dither}$ to 32 (nominal +3.125% frequency) for three ck_ref cycles, allowing one of these ck_ref cycles for settling and measuring the average frequency $F_{DCO\_3p}$ over the last two of the three ck_ref cycles. Then, set $F_{dither}$ to −32 (nominal −3.125% frequency) for the next three ck_ref cycles, allowing one of these ck_ref cycles for settling and measuring the average frequency $F_{DCO\_3n}$ over the last two of the three ck_ref cycles.
6. Repeat step 5 three more times, until $F_{DCO\_3p}$ comprises an average of $F_{DCO}$ made over eight ck_ref cycles with $F_{dither}$=32 and $F_{DCO\_3n}$ comprises an average of $F_{DCO}$ made over eight ck_ref cycles with $F_{dither}$=−32.
7. Compute the average frequency $F_{DCO\_3}$=($F_{DCO\_3p}$+$F_{DCO\_3n}$)·0.5 and difference frequency $F_{DIFF\_3}$=$F_{DCO\_3p}$−$F_{DCO\_3n}$. Update the variables Gain and Vpch according to the following equations. Gain=Gain_1=(16·$F_{DIFF\_3}$/$F_{DCO\_3}$)·(208/Gf+Gain_0)−208/Gf, and Vpch=Vpch_4=Vpch_3·(2−$F_{DCO\_3}$/MDIV)+Vpch_3·(Gain_0−Gain_1)/(208/Gf+Gain_0)/(208/Gf+Gain_0). Allow two ck_ref cycles for settling.
8. Begin the second of three iterations on Gain by setting $F_{dither}$ to 32 (nominal+3.125% frequency) for five ck_ref cycles, allowing one of these ck_ref cycles for settling and measuring the average frequency $F_{DCO\_4p}$ over the last four of the five ck_ref cycles. Then, set $F_{dither}$ to −32 (nominal −3.125% frequency) for the next five ck_ref cycles, allowing one of these ck_ref cycles for settling and measuring the average frequency $F_{DCO\_4n}$ over the last four of the five ck_ref cycles.
9. Repeat step 8 three more times, until $F_{DCO\_4p}$ comprises an average of $F_{DCO}$ made over 16 ck_ref cycles with $F_{dither}$=32 and $F_{DCO\_4n}$ comprises an average of $F_{DCO}$ made over 16 ck_ref cycles with $F_{dither}$=−32.
10. Compute the average frequency $F_{DCO\_4}$=($F_{DCO\_4p}$+$F_{DCO\_4n}$)·0.5 and difference frequency $F_{DIFF\_4}$=$F_{DCO\_4p}$−$F_{DCO\_4n}$. Update the variables Gain and Vpch according to the following equations. Gain=Gain_2=(16·$F_{DIFF\_4}$/$F_{DCO\_4}$)·(208/Gf+Gain_1)−208/Gf, and Vpch=Vpch_5=Vpch_4·(2−$F_{DCO\_4}$/MDIV)+Vpch_4·(Gain_1−Gain_2)/(208/Gf+gain_1). Allow two ck_ref cycles for settling.
11. Begin the last of three iterations on Gain by setting $F_{dither}$ to 32 (nominal+3.125% frequency) for nine ck_ref cycles, allowing one of these ck_ref cycles for settling and measuring the average frequency $F_{DCO\_5p}$ over the last eight of the nine ck_ref cycles. Then, set $F_{dither}$ to −32 (nominal −3.125% frequency) for the next nine ck_ref cycles, allowing one of these ck_ref cycles for settling and measuring the average frequency $F_{DCO\_5n}$ over the last eight of the nine ck_ref cycles.
12. Repeat step 11 three more times, until $F_{DCO\_5p}$ comprises an average of $F_{DCO}$ made over 32 ck_ref cycles with $F_{dither}$=32 and $F_{DCO\_5n}$ comprises an average of $F_{DCO}$ made over 32 ck_ref cycles with $F_{dither}$=−32.
13. Compute the average frequency $F_{DCO\_5}$=($F_{DCO\_5p}$+$F_{DCO\_5n}$)·0.5 and difference frequency $F_{DIFF\_5}$=$F_{DCO\_5p}$−$F_{DCO\_5n}$. Update the variables Gain and Vpch according to the following equations. Gain=Gain_3=(16·$F_{DIFF\_5}$/$F_{DCO\_5}$)·(208/Gf+Gain_2)−(208/Gf, and Vpch=Vpch_6=Vpch_5·(2−$F_{DCO\_5}$/MDIV)+Vpch_5·(Gain_2−Gain_3)/(208/Gf+Gain_2). Allow two ck_ref cycles for settling.
14. The final step of the precharge algorithm is to copy the contents of the fractional feedback counter 160 into the reference accumulator 110, open switches 790 and 792, and allow normal closed-loop operation of the PLL to resume.

Upon completion of the precharge algorithm, the DCO frequency is within a percent or so of its target frequency and the DCO phase is aligned within a few % UI of its target phase so that the time required for exact frequency and phase settling is minimized. In addition, the percent change in DCO frequency due to a change of 32 thermometer cells in DCO DAC 720 has been trimmed to about 3.125% with a tolerance of nearly ±$2^{-(6+5)}$/10·100%=±0.005% due to measurement error (assumes a resolution of six fractional bits in the fractional feedback counter and averaging over $2^5$ ck_ref cycles in the final gain iteration step with a minimum MDIV value of ten), and a tolerance of about ±3.125/(208/Gf+70)=±0.016% due to the resolution of the gain control DAC 730.

Figure 9:
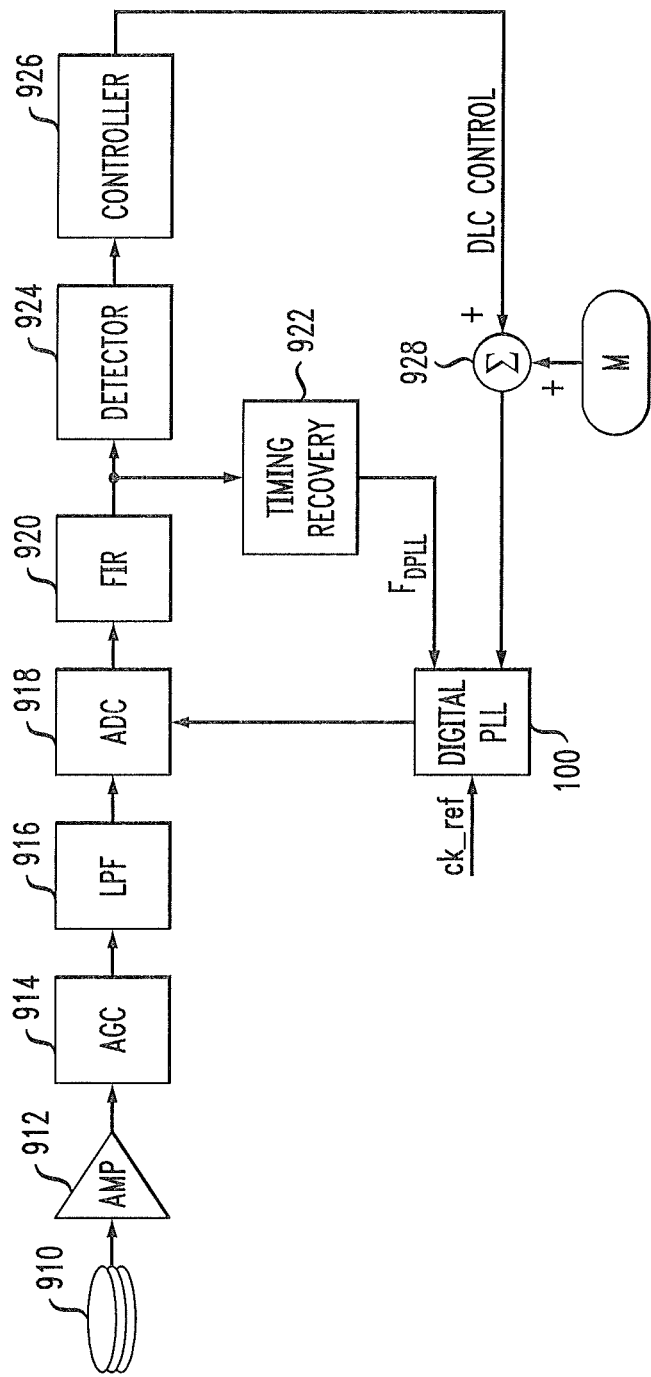
FIG. 9 illustrates a hard disk drive read channel containing a digital phase locked loop circuit according to one embodiment of the invention.

FIG. 9 illustrates a hard disk drive read channel containing a digital PLL 100 (as described above in the context of FIGS. 1-8). Data is read from disk 910 and processed through preamplifier 912, automatic gain control 914, and low pass filter 916 before being sampled by analog-to-digital (ADC) unit 918. Digital PLL 100 provides a clock to ADC 918. Digital filter (FIR) 920 and timing recovery unit 922 compute a frequency control word $F_{DPLL}$ for digital PLL 100 such that data from disk 910 is synchronously sampled by ADC 918. Timing recovery unit 922 is also capable of quickly slewing the phase of digital PLL 100 during initial data acquisition, a function commonly referred to as zero-phase-start.

Direct modulation of DCO 140 contained within digital PLL 100 by control signal $F_{DPLL}$ advantageously supports an oversampling ADC through the availability of the 8-phase output of DCO 140. Furthermore, through the detection of periodic synchronization marks on disk using detector 924 and controller 926, a disk-lock-clock (DLC) control (summed in summer 928 with M) can be used to control the frequency of digital PLL 100 to track frequency variation caused by disk wobble.

Figure 10:
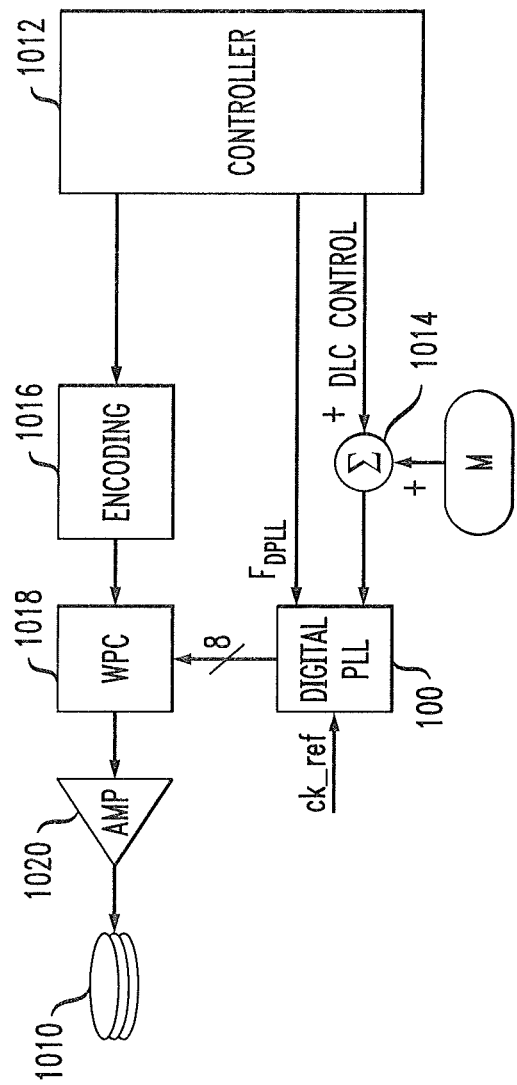
FIG. 10 illustrates a hard disk drive write channel containing a digital phase locked loop circuit according to one embodiment of the invention.

FIG. 10 illustrates a hard disk drive write channel containing a digital PLL 100 (as described above in the context of FIGS. 1-8). Data to be written to the disk 1010 is sent at the appropriate time from controller 1012 and is appropriately formatted in encoding unit 1016. Bit transition delays are adjusted in write precompensation (WPC) unit 1018 to compensate for the magnetic interaction that occurs between bits when preamp 1020 writes data to disk 1010. By providing timing information via an 8-phase clock that is a fraction of a bit period, DPLL 100 simplifies the WPC 1018 process of delaying each bit transition by an amount of time that is a small fraction of the bit period.

Furthermore, digital PLL 100 is capable of simultaneously adjusting all eight phases of its output clock in order to synchronize the data bits being written to disk 1010 with data that already exists on the disk. Data synchronization is an important requirement for bit-patterned-media where each bit must be written to a small fixed island of magnetic material on the disk. To synchronize the write data with data already existing on the disk, the phase of the digital PLL clock can be quickly shifted between read and write operations using the $F_{DPLL}$ control to account for differences in the read and write path delays. Furthermore, the phase of the write data can be adjusted in a more relaxed manner by the DLC control (summed with M in summer 1014) to track timing shifts caused by disk wobble.

It is to be appreciated that one or more of the elements shown in the read channel circuitry of FIG. 9 and the write channel circuitry of FIG. 10 can be shared between channels.

Figure 11:
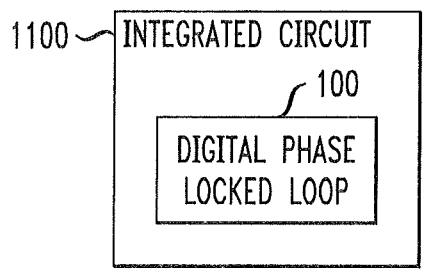
FIG. 11 illustrates an integrated circuit comprising a digital phase locked loop circuit according to one embodiment of the invention.

At least a portion of the circuitry and methodologies described herein can be implemented in one or more integrated circuits. In forming integrated circuits, die are typically fabricated in a repeated pattern on a surface of a semiconductor wafer. Each of the die can include a device described herein, and can include other structures or circuits. Individual die are cut or diced from the wafer, then packaged as integrated circuits. One skilled in the art would know how to dice wafers and package die to produce integrated circuits. Integrated circuits so manufactured are considered embodiments of this invention. FIG. 11 illustrates an integrated circuit 1100 comprising digital PLL 100 according to one embodiment of the invention.

As indicated previously, digital PLL 100 can be implemented in a wide variety of different types of systems. Another embodiment of such a system is the data processing system 1200 shown in FIG. 12. This system comprises a hard disk drive (HDD) 1202 coupled to a host device 1204. The HDD 1202 comprises an SOC integrated circuit 1206 comprising a disk controller 1208 coupled to read/write channel circuitry 1210. The read/write channel circuitry 1210 comprises digital PLL 100.

The SOC 1206 communicates via a preamplifier 1212 with a read/write head 1214 in order to write data to and read data from one or more storage disks 1216. The read/write channel circuitry 1210 can also include a digital signal processor (DSP) that comprises conventional signal processing components typically associated with HDD read and write channels.

The host device 1204 comprises, for example, a computer or other processing device that is coupled to or incorporates the HDD 1202. Such a processing device comprises a processor 1218 and memory 1220 used to execute software code. The SOC 1206 can also comprise processor and memory elements used to execute software code. The software code stored in a memory of system 1200 can be used for controlling operations of digital PLL 100 of the SOC 1206.

A given such memory that stores software code for execution by a corresponding processor is an example of what is more generally referred to herein as a computer-readable storage medium or other type of computer program product having computer program code embodied therein, and comprises, for example, electronic memory such as random access memory (RAM) or read-only memory (ROM), magnetic memory, optical memory, or other types of storage devices in any combination.

The processor can comprise a microprocessor, a central processing unit (CPU), an application specific integrated circuit (ASIC), a field programmable gate array (FPGA) or other type of processing device, as well as portions or combinations of such devices. Although not expressly shown in FIG. 12, such a processor can be implemented in the SOC 1206, or in another part of the HDD 1202.

An example of an SOC integrated circuit that can be modified for use in embodiments of the invention is disclosed in U.S. Pat. No. 7,872,825, entitled "Data Storage Drive with Reduced Power Consumption," which is commonly assigned herewith and incorporated by reference herein.

Other types of integrated circuits that can be used to implement processor, memory or other system components of a given embodiment include, for example, a microprocessor, ASIC, FPGA or other integrated circuit device.

Figure 12:
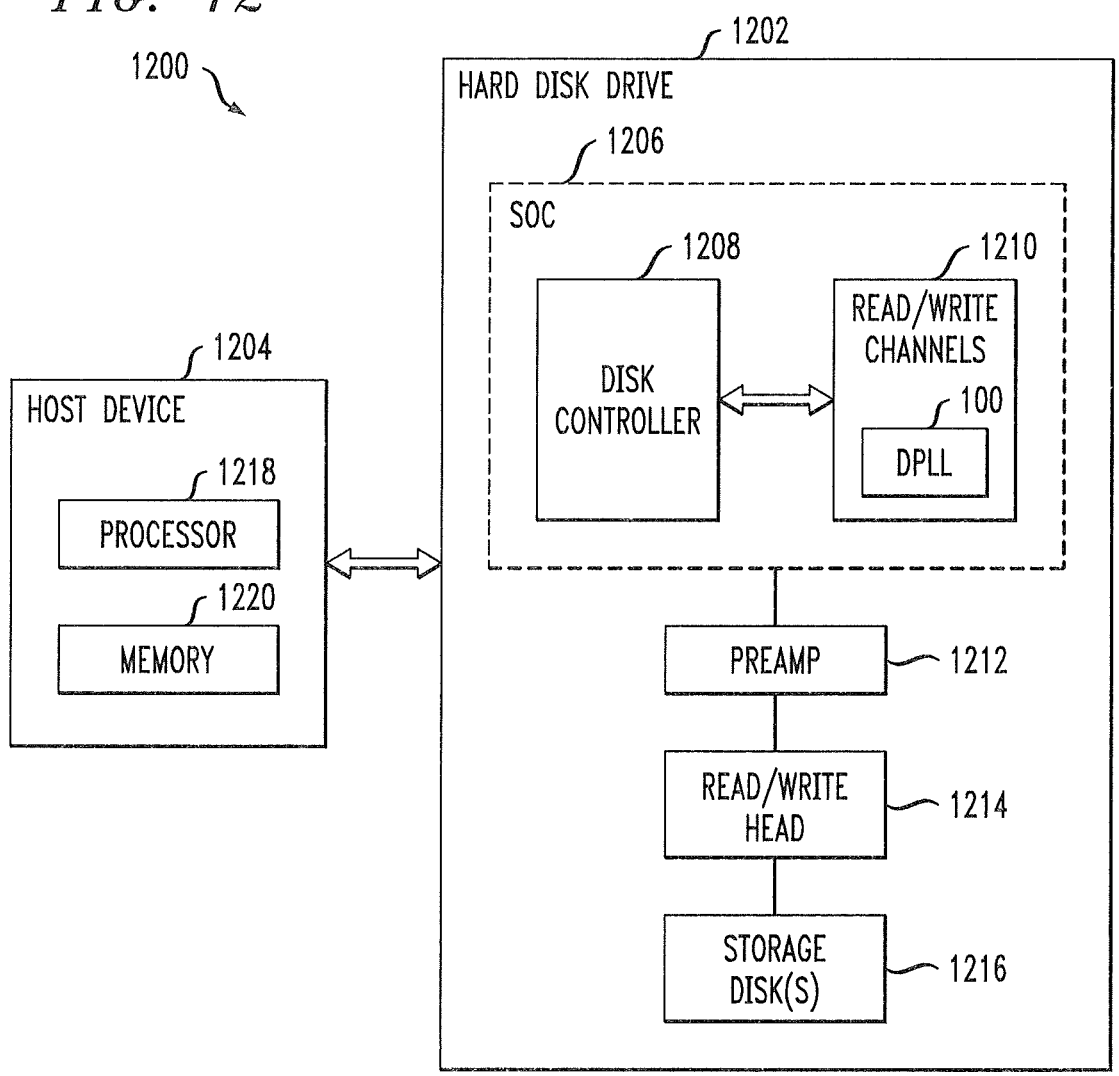
FIG. 12 illustrates a data processing system comprising a storage device having a digital phase locked loop circuit of the type shown in FIG. 1.

Multiple instances of the HDD 1202 of FIG. 12 can be incorporated into a virtual storage system. Such a virtual storage system, also referred to as a storage virtualization system, can illustratively comprise a virtual storage controller coupled to a RAID system, where RAID denotes Redundant Array of Independent Disks. The RAID system more specifically comprises a plurality of distinct storage devices, one or more of which are assumed to be configured to include digital PLL circuitry as disclosed herein. These and other virtual storage systems comprising HDDs or other disk-based storage devices are considered embodiments of the invention. The host processing device 1204 in FIG. 12 can also be an element of a virtual storage system, and can incorporate the above-noted virtual storage controller.

Again, it should be emphasized that the above-described embodiments of the invention are intended to be illustrative. For example, other embodiments can use different types and arrangements of storage disks, read/write heads, control circuitry and other storage device elements for implementing the described functionality. These and numerous other alternative embodiments within the scope of the following claims will be apparent to those skilled in the art.

What is claimed is:

1. An apparatus, comprising:
digitally controlled oscillator circuitry;
feedback circuitry operatively coupled to the digitally controlled oscillator circuitry; and
comparison circuitry operatively coupled to the digitally controlled oscillator circuitry and the feedback circuitry;
wherein the digitally controlled oscillator circuitry is capable of generating a clock signal;
wherein the feedback circuitry, in response to the clock signal, is capable of generating a first digital value representing a detected phase of the clock signal for a given cycle of the clock signal;
wherein the comparison circuitry, in response to the first digital value and to a second digital value representing a reference phase, is capable of generating a phase error value which is useable to generate a first digital control word for controlling a frequency associated with the clock signal;
wherein the digitally controlled oscillator circuitry further comprises adjustment circuitry that is capable of, in response to a second digital control word, applying a phase adjustment to the clock signal.

2. The apparatus of claim 1, wherein the adjustment circuitry of the digitally controlled oscillator circuitry further comprises a digital-to-analog converter capable of applying the phase adjustment to the clock signal in response to the second digital control word.

3. The apparatus of claim 1, further comprising reference accumulator circuitry operatively coupled to the comparison circuitry, wherein the reference accumulator circuitry is capable of generating the second digital value based on a given incrementing value.

4. The apparatus of claim 1, further comprising phase accumulator circuitry which is capable of tracking an accumulated phase due to the phase adjustment applied by the adjustment circuitry of the digitally controlled oscillator circuitry in response to the second digital control word.

5. The apparatus of claim 1, further comprising loop filter circuitry operatively coupled to the comparison circuitry and the digitally controlled oscillator circuitry, wherein the loop filter circuitry is capable of generating the first digital control word in response to the phase error value.

6. The apparatus of claim 1, wherein the digitally controlled oscillator circuitry further comprises ring oscillator circuitry which is capable of generating the clock signal.

7. The apparatus of claim 6, wherein the ring oscillator circuitry further comprises a plurality of differential delay cells.

8. The apparatus of claim 6, wherein the digitally controlled oscillator circuitry further comprises a precharge capacitor, wherein a bias voltage associated with the precharge capacitor is adjustable under control of precharge circuitry so that an initial frequency of the clock signal is close to a desired target frequency.

9. The apparatus of claim 8, wherein the digitally controlled oscillator circuitry further comprises one or more digital-to-analog converters operatively coupled to the precharge capacitor, wherein the one or more digital-to-analog converters are capable of controlling a bias current usable by the ring oscillator circuitry to generate the clock signal.

10. The apparatus of claim 9, wherein the precharge circuitry is capable of converging on the desired target frequency based on an estimate of the initial frequency and an estimate of a gain relationship between the clock signal and the one or more digital-to-analog converters.

11. The apparatus of claim 10, wherein the precharge circuitry is capable of calibrating a gain associated with at least one of the one or more digital-to-analog converters by dithering the digital-to-analog converter and measuring a frequency variation of the clock signal.

12. The apparatus of claim 8, wherein the precharge circuitry is capable of applying a phase lock function.

13. The apparatus of claim 1, wherein the feedback circuitry further comprises counter circuitry, wherein the counter circuitry is capable of detecting a phase of the clock signal over a given range of elapsed cycles of the digitally controlled oscillator circuitry.

14. The apparatus of claim 13, wherein the feedback circuitry further comprises fractional detector circuitry, wherein the fractional detector circuitry is capable of detecting a state of the digitally controlled oscillator circuitry at a transition of a reference clock signal.

15. The apparatus of claim 14, wherein the feedback circuitry further comprises sub-fractional detector circuitry, wherein the sub-fractional detector circuitry is capable of detecting when the transition of the reference clock signal occurs relative to a transition in the state of the digitally controlled oscillator circuitry.

16. The apparatus of claim 15, wherein the sub-fractional detector circuitry further comprises one or more differential delay cells capable of generating one or more sub-fractional intervals.

17. The apparatus of claim 15, wherein the sub-fractional detector circuitry further comprises background trimming circuitry capable of adjusting a sub-fractional delay.

18. The apparatus of claim 15, wherein the sub-fractional detector circuitry further comprises a self-calibration function capable of normalizing a sub-fractional delay using the number of sub-fractional delays between adjacent phases of the clock signal.

19. The apparatus of claim 1, wherein the digitally controlled oscillator circuitry, the feedback circuitry and the comparison circuitry are part of a digital phase locked loop circuit.

20. The apparatus of claim 19, wherein the digital phase locked loop circuit is part of at least one of read channel circuitry and write channel circuitry of a disk storage system.

21. An integrated circuit comprising the apparatus of claim 1.

22. A method, comprising:
generating a clock signal via digitally controlled oscillator circuitry;
generating a first digital value via feedback circuitry coupled to the digitally controlled oscillator circuitry, in response to the clock signal, the first digital value representing a detected phase of the clock signal for a given cycle of the clock signal;
generating a phase error value via comparison circuitry coupled to the feedback circuitry in response to the first digital value and to a second digital value representing a reference phase, wherein the phase error value is useable to generate a first digital control word for controlling a frequency associated with the clock signal; and
applying a phase adjustment to the clock signal in response to a second digital control word.

* * * * *